(12) United States Patent
Machii et al.

(10) Patent No.: US 8,410,000 B2
(45) Date of Patent: *Apr. 2, 2013

(54) METHOD FOR PRODUCING PHOTOVOLTAIC CELL

(75) Inventors: Youichi Machii, Tsukuba (JP); Masato Yoshida, Tsukuba (JP); Takeshi Nojiri, Tsukuba (JP); Kaoru Okaniwa, Tsukuba (JP); Mitsunori Iwamuro, Tsukuba (JP); Shuuichirou Adachi, Tsukuba (JP); Akihiro Orita, Tsukuba (JP); Tetsuya Satou, Tsukuba (JP); Keiko Kizawa, Tsukuba (JP)

(73) Assignee: Hitachi Chemical Company, Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/298,535

(22) Filed: Nov. 17, 2011

(65) Prior Publication Data

US 2012/0122264 A1 May 17, 2012

Related U.S. Application Data

(60) Provisional application No. 61/414,585, filed on Nov. 17, 2010.

(51) Int. Cl.
*H01L 21/31* (2006.01)
(52) U.S. Cl. .......... 438/758; 438/795; 257/E21.324
(58) Field of Classification Search .......... 438/74, 438/89; 257/E21.14, E21.536
See application file for complete search history.

(56) References Cited

U.S. PATENT DOCUMENTS 7,141,863 B1 * 11/2006 Compaan et al. ............ 257/530

FOREIGN PATENT DOCUMENTS

| JP | 2004-193350 A | 7/2004 |
| JP | 2004-221149 A | 8/2004 |

OTHER PUBLICATIONS

L. Debarge et al., "Selective emitter formation with a single screen-printed p-doped paste deposition using out-diffusion in an RTP-step", Solar Energy Materials & Solar Cells 74 (2002) pp. 71-75.

* cited by examiner

*Primary Examiner* — Cheung Lee
(74) *Attorney, Agent, or Firm* — Miles & Stockbridge P.C.

(57) ABSTRACT

The method for producing a photovoltaic cell includes applying, on a partial region of one surface side of a semiconductor substrate, a first p-type diffusion layer forming composition including a p-type impurity-containing glass powder and a dispersion medium; applying, on at least a region other than the partial region on the surface of the semiconductor substrate, a second p-type diffusion layer forming composition which includes a p-type impurity-containing glass powder and a dispersion medium and in which a concentration of the p-type impurity is lower than that of the first p-type diffusion layer forming composition, where the first p-type diffusion layer forming composition is applied; heat-treating the semiconductor substrate on which the first p-type diffusion layer forming composition and the second p-type diffusion layer forming composition are applied to form a p-type diffusion layer; and forming an electrode on the partial region.

3 Claims, 1 Drawing Sheet

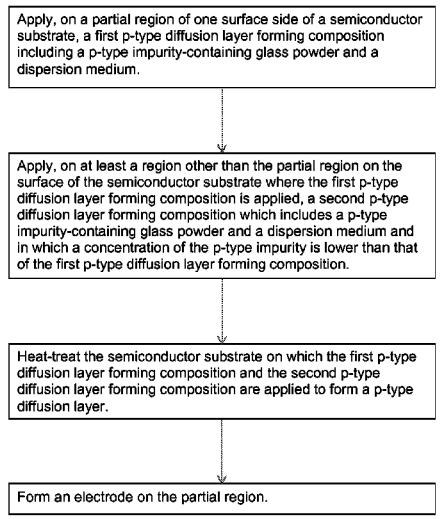

Apply, on a partial region of one surface side of a semiconductor substrate, a first p-type diffusion layer forming composition including a p-type impurity-containing glass powder and a dispersion medium.

Apply, on at least a region other than the partial region on the surface of the semiconductor substrate where the first p-type diffusion layer forming composition is applied, a second p-type diffusion layer forming composition which includes a p-type impurity-containing glass powder and a dispersion medium and in which a concentration of the p-type impurity is lower than that of the first p-type diffusion layer forming composition.

Heat-treat the semiconductor substrate on which the first p-type diffusion layer forming composition and the second p-type diffusion layer forming composition are applied to form a p-type diffusion layer.

Form an electrode on the partial region.

METHOD FOR PRODUCING PHOTOVOLTAIC CELL

CROSS-REFERENCE TO RELATED APPLICATIONS

This application claims priority under 35 U.S.C. 119(e) to Provisional U.S. Patent Applications No. 61/414,585, filed Nov. 17, 2010, the disclosure of which is incorporated by reference herein.

BACKGROUND OF THE INVENTION

1. Field of the Invention

The present invention relates to a method for producing a photovoltaic cell.

2. Description of the Related Art

In the producing of a photovoltaic cell having a pn conjunction in the related art, for example, a p-type impurity is diffused into an n-type semiconductor substrate formed of silicon or the like and thereby a p-type diffusion layer is formed. Accordingly, the pn conjunction is formed.

Particularly, as a structure of photovoltaic cell for increasing conversion efficiency, a selective emitter structure, in which the impurity concentration in a region other than the region directly under an electrode is made to be lower than the impurity concentration in the region directly under the electrode, is disclosed (for example, refer to L. Debarge, M. Schott, J.C. Muller, R. Monna, Solar Energy Materials & Solar Cells 74 (2002) 71-75). In the structure, since the region in which the impurity concentration is high is formed directly under the electrode (hereinafter, the region is referred to as "selective emitter"), the contact resistance between a metallic electrode and the silicon can be reduced, on the other hand, in regions other than the region directly under the metallic electrode, the impurity concentration is low, such that it is possible to improve the conversion efficiency of the photovoltaic cell.

To form the selective emitter structure described above, there is necessary a complicated process in which plural diffusions and partial etching through masking or the like are repeated (for example, refer to Japanese Patent Application Laid-Open (JP-A) No. 2004-193350).

In addition, a method in which a diffusing agent is applied onto a substrate with a plurality of impurity concentrations through an ink jet method, and impurities are diffused is disclosed (for example, refer to JP-A No. 2004-221149).

SUMMARY OF THE INVENTION

An embodiment according to the present invention is a method for producing a photovoltaic cell, including:

applying, on a partial region of one surface side of a semiconductor substrate, a first p-type diffusion layer forming composition including a p-type impurity-containing glass powder and a dispersion medium;

applying, on at least a region other than the partial region on the surface of the semiconductor substrate where the first p-type diffusion layer forming composition is applied, a second p-type diffusion layer forming composition which includes a p-type impurity-containing glass powder and a dispersion medium and in which a concentration of the p-type impurity is lower than that of the first p-type diffusion layer forming composition;

heat-treating the semiconductor substrate on which the first p-type diffusion layer forming composition and the second p-type diffusion layer forming composition are applied to form a p-type diffusion layer; and forming an electrode on the partial region.

BRIEF DESCRIPTION OF THE DRAWING

The sole figure is a flow chart illustrating the method of the invention.

DETAILED DESCRIPTION OF THE INVENTION

In the method disclosed in JP-A No. 2004-193350, to form the selective emitter structure, processes for the pattern formation and the etching are necessary, and therefore the number of process is apt to increase. In addition, in the ink jet method disclosed in JP-A No. 2004-221149, a dedicated device including a plurality of heads is necessary, and the control of spraying from each head also becomes complex.

An object of the invention is to provide a method for producing a photovoltaic cell, which allows a photovoltaic cell having a selective emitter structure to be produced by a simple method without requiring a complicated device.

The above-stated problems are addressed by the following means.

<1> A method for producing a photovoltaic cell, including: applying, on a partial region of one surface side of a semiconductor substrate, a first p-type diffusion layer forming composition including a p-type impurity-containing glass powder and a dispersion medium; applying, on at least a region other than the partial region on the surface of the semiconductor substrate where the first p-type diffusion layer forming composition is applied, a second p-type diffusion layer forming composition which includes a p-type impurity-containing glass powder and a dispersion medium and in which a concentration of the p-type impurity is lower than that of the first p-type diffusion layer forming composition; heat-treating the semiconductor substrate on which the first p-type diffusion layer forming composition and the second p-type diffusion layer forming composition are applied to form a p-type diffusion layer; and forming an electrode on the partial region.

<2> The method for producing a photovoltaic cell according to <1>, wherein the p-type impurity includes at least one kind of element selected from the group consisting of B (boron), Al (aluminum), and Ga (gallium).

<3> The method for producing a photovoltaic cell according to <1> or <2>, wherein the p-type impurity-containing glass powder includes, at least one kind of p-type impurity-containing material selected from the group consisting of $B_2O_3$, $Al_2O_3$, and $Ga_2O_3$, and at least one kind of glass component material selected from the group consisting of $SiO_2$, $K_2O$, $Na_2O$, $Li_2O$, BaO, SrO, CaO, MgO, BeO, ZnO, PbO, CdO, $V_2O_5$, SnO, $ZrO_2$, $TiO_2$, and $MoO_3$.

In the present specification, the term "process" denotes not only independent processes but also processes that cannot be clearly distinguished from other processes as long as a purpose is accomplished by the process. And "from . . . to . . . " denotes a range including each of the minimum value and the maximum value of the values described in this expression. Unless specifically indicated, when an each ingredient of a composition includes plural materials, a content of the each ingredient of the composition denotes total amount of the plural materials including the composition.

The configuration of a method for producing a photovoltaic cell of the invention includes a process of applying a first p-type diffusion layer forming composition including a p-type impurity-containing glass powder and a dispersion medium onto a partial region on one surface side of a semiconductor substrate, a process of applying a second p-type diffusion layer forming composition which includes a p-type impurity-containing glass powder and a dispersion medium and in which the concentration of the p-type impurity is lower than that of the first p-type diffusion layer forming composition, onto at least a region other than the partial region on the surface of the semiconductor substrate where the first p-type diffusion layer forming composition, a process of heat-treating the semiconductor substrate onto which the first p-type diffusion layer forming composition and the second p-type diffusion layer forming composition are applied to form a p-type diffusion layer, forming an electrode on the partial region, and optionally other processes as necessary.

First, a first p-type diffusion layer forming composition, and a second p-type diffusion layer forming composition (hereinafter, these are simply referred to as "p-type diffusion layer forming composition") of the invention will be described, and then, a method for forming a selective emitter structure using the p-type diffusion layer forming composition will be described.

The p-type diffusion layer forming composition includes at least one kind of p-type impurity-containing glass powder, and at least one kind of dispersion medium, and may optionally include other additives in consideration of the coating properties.

Here, the p-type diffusion layer forming composition represents a material that includes a p-type impurity and that is able to form a p-type diffusion layer through being applied onto a silicon substrate and then thermally diffusing the p-type impurity. When the p-type diffusion layer forming composition is used, the p-type diffusion layer is formed at a desired portion.

Since a p-type impurity component in the glass powder is hardly volatilized even during sintering, a p-type diffusion layer is prevented from also being formed on the rear surface or side face, rather than on the front surface alone due to the generation of volatile gases. It is assumed that the reason for this is that the p-type impurity component combines with an element in a glass powder, or is absorbed into the glass, as a result of which the p-type impurity component is hardly volatilized.

Glass Powder

The term "p-type impurity" included in the glass powder refers to an element which is capable of forming a p-type diffusion layer by doping thereof on a silicon substrate. As the p-type impurity, elements of Group XIII of the periodic table can be used. Examples of the p-type impurity include B (boron), Al (aluminum), and Ga (gallium).

Examples of the p-type impurity-containing material include $B_2O_3$, $Al_2O_3$, and $Ga_2O_3$. At least one selected from $B_2O_3$, $Al_2O_3$, and $Ga_2O_3$ is preferably used.

Further, the melting temperature, softening point, glass-transition point, chemical durability or the like of the glass powder can be controlled by adjusting the component ratio, if necessary. Further, the glass powder preferably contains the components mentioned below.

Examples of the glass component material include $SiO_2$, $K_2O$, $Na_2O$, $Li_2O$, $BaO$, $SrO$, $CaO$, $MgO$, $BeO$, $ZnO$, $PbO$, $CdO$, $Tl_2O$, $V_2O_5$, $SnO$, $ZrO_2$, $WO_3$, $MoO_3$, $MnO$, $La_2O_3$, $Nb_2O_5$, $Ta_2O_5$, $Y_2O_3$, $TiO_2$, $GeO_2$, $TeO_2$, and $Lu_2O_3$. At least one selected from $SiO_2$, $K_2O$, $Na_2O$, $Li_2O$, $BaO$, $SrO$, $CaO$, $MgO$, $BeO$, $ZnO$, $PbO$, $CdO$, $V_2O_5$, $SnO$, $ZrO_2$, $TiO_2$ and $MoO_3$ is preferably used.

Specific examples of the p-type impurity-containing glass powder include those including both the p-type impurity-containing material and the glass component material such as, for example, $B_2O_3$ based glass which includes $B_2O_3$ as the p-type impurity such as $B_2O_3$—$SiO_2$ (the p-type impurity-containing material and the glass component material are listed in this order, and are listed in the same order below) based glass, $B_2O_3$—$ZnO$ based glass, $B_2O_3$—$PbO$ based glass, single $B_2O_3$ based glass; $Al_2O_3$ based glass which includes $Al_2O_3$ as the acceptor element such as $Al_2O_3$—$SiO_2$ based glass; and $Ga_2O_3$ based glass which includes $Ga_2O_3$ as the acceptor element such as $Ga_2O_3$—$SiO_2$ based glass.

The p-type impurity-containing glass powder may include two or more p-type impurity-containing materials such as $Al_2O_3$—$B_2O_3$, $Ga_2O_3$—$B_2O_3$ or the like.

Although composite glasses containing one or two components have been exemplified in the above, glass powder containing three or more components, such as $B_2O_3$—$SiO_2$—$Na_2O$, may also be used as necessary.

The content of the glass component material in the glass powder is preferably appropriately set taking into consideration the melting temperature, the softening point, the glass-transition point, and chemical durability. Generally, the content of the glass component material is preferably from 0.1% by mass to 95% by mass, and more preferably from 0.5% by mass to 90% by mass.

The softening point of the glass powder is preferably in the range of from 200° C. to 1000° C., and more preferably from 300° C. to 900° C., from the viewpoint of diffusivity during the diffusion treatment, and dripping.

The shape of the glass powder includes a substantially spherical shape, a flat shape, a block shape, a plate shape, a scale-like shape, and the like. From the viewpoint of coating property and uniform dispersion property, it is preferably a spherical shape, a flat shape, or a plate shape.

The average particle diameter of the glass powder is preferably 100 µm or less. When a glass powder having an average particle diameter of 100 µm or less is used, a smooth coated film can be easily obtained. Further, the average particle diameter of the glass powder is more preferably 50 µm or less and further preferably 10 µm or less. The lower limit of the average particle diameter is not particularly limited, and preferably 0.01 µm or more.

The average particle diameter of the glass powder means the mean volume diameter, and may be measured by laser diffraction particle size analyzer.

The p-type impurity-containing glass powder is prepared according to the following procedure.

First, raw materials are weighed and placed in a crucible. Examples of the material for the crucible include platinum, platinum-rhodium, iridium, alumina, quartz and carbon, which are appropriately selected taking into consideration the melting temperature, atmosphere, reactivity with melted materials, and the like.

Next, the raw materials are heated to a temperature corresponding to the glass composition in an electric furnace, thereby preparing a solution. At this time, stirring is preferably applied such that the solution becomes homogenous.

Subsequently, the obtained solution is allowed to flow on a zirconia or carbon plate or the like to result in vitrification of the solution.

Finally, the glass is pulverized into a powder. The pulverization can be carried out by using a known method such as using a jet mill, a bead mill, or a ball mill.

The content of the p-type impurity-containing glass powder in the p-type diffusion layer forming composition is determined taking into consideration coatability, diffusivity of p-type impurities, and the like. Generally, the content of the glass powder in the p-type diffusion layer forming composition is preferably from 0.1% by mass to 95% by mass, more preferably from 1% by mass to 90% by mass, still more preferably from 1.5% by mass to 85% by mass, and furthermore preferably from 2% by mass to 80% by mass.

Dispersion Medium

Hereinafter, a dispersion medium will be described.

The dispersion medium is a medium which disperses the glass powder in the composition. Specifically, a binder, a solvent or the like is employed as the dispersion medium.

Binder

For example, the binder may be appropriately selected from a, polyvinyl alcohol, polyacrylamides, polyvinyl amides, polyvinyl pyrrolidone, polyethylene oxides, polysulfonic acid, acrylamide alkyl sulfonic acid, cellulose derivatives such as cellulose ethers, carboxymethylcellulose, hydroxyethylcellulose, ethylcellulose, gelatin, starch and starch derivatives, sodium alginates, xanthane and xanthane derivatives, guar and guar derivatives, scleroglucan, tragacanth or dextrin derivatives, (meth)acrylic acid resins, (meth)acrylic acid ester resins (for example, alkyl (meth)acrylate resins, dimethlaminoethyl (meth)acrylate resins, or the like), butadiene resins, styrene resins, copolymers thereof, siloxane resins and the like. These compounds may be used individually or in a combination of two or more thereof The molecular weight of the binder is not particularly limited and is preferably appropriately adjusted taking into consideration the desired viscosity of the composition.

Solvent

Examples of the solvent include ketone solvents such as acetone, methylethylketone, methyl-n-propylketone, methyl-iso-propylketone, methyl-n-butylketone, methyl-iso-butylketone, methyl-n-pentylketone, methyl-n-hexylketone, diethylketone, dipropylketone, di-iso-butylketone, trimethylnonanone, cyclohexanone, cyclopentanone, methylcyclohexanone, 2,4-pentanedione, and acetonylacetone; ether solvents such as diethyl ether, methyl ethyl ether, n-di-n-propyl ether, di-iso-propyl ether, tetrahydrofuran, methyl tetrahydrofuran, dioxane, dimethyl dioxane, ethylene glycol dimethyl ether, ethylene glycol diethyl ether, ethylene glycol di-n-propyl ether, ethylene glycol dibutyl ether, diethylene glycol dimethyl ether, diethylene glycol diethyl ether, diethylene glycol methyl ethyl ether, diethylene glycol methyl n-propyl ether, diethylene glycol methyl n-butyl ether, diethylene glycol di-n-propyl ether, diethylene glycol di-n-butyl ether, diethylene glycol methyl n-hexyl ether, triethylene glycol dimethyl ether, triethylene glycol diethyl ether, triethylene glycol methyl ethyl ether, triethylene glycol methyl n-butyl ether, triethylene glycol di-n-butyl ether, triethylene glycol methyl n-hexyl ether, tetraethylene glycol dimethyl ether, tetraethylene glycol diethyl ether, tetradiethylene glycol methyl ethyl ether, tetraethylene glycol methyl n-butyl ether, tetraethylene glycol di-n-butyl ether, tetraethylene glycol methyl n-hexyl ether, tetraethylene glycol di-n-butyl ether, propylene glycol dimethyl ether, propylene glycol diethyl ether, propylene glycol di-n-propyl ether, propylene glycol dibutyl ether, dipropylene glycol dimethyl ether, dipropylene glycol diethyl ether, dipropylene glycol methyl ethyl ether, dipropylene glycol methyl n-butyl ether, dipropylene glycol di-n-propyl ether, dipropylene glycol di-n-butyl ether, dipropylene glycol methyl n-hexyl ether, tripropylene glycol dimethyl ether, tripropylene glycol diethyl ether, tripropylene glycol methyl ethyl ether, tripropylene glycol methyl n-butyl ether, tripropylene glycol di-n-butyl ether, tripropylene glycol methyl n-hexyl ether, tetrapropylene glycol dimethyl ether, tetrapropylene glycol diethyl ether, tetradipropylene glycol methyl ethyl ether, tetrapropylene glycol methyl n-butyl ether, tetrapropylene glycol di-n-butyl ether, tetrapropylene glycol methyl n-hexyl ether, and tetrapropylene glycol di-n-butyl ether; ester solvents such as methyl acetate, ethyl acetate, n-propyl acetate, i-propyl acetate, n-butyl acetate, i-butyl acetate, sec-butyl acetate, n-pentyl acetate, sec-pentyl acetate, 3-methoxybutyl acetate, methyl pentyl acetate, 2-ethyl butyl acetate, 2-ethyl hexyl acetate, 2-(2-butoxyethoxy)ethyl acetate, benzyl acetate, cyclohexyl acetate, methyl cyclohexyl acetate, nonyl acetate, methyl acetoacetate, ethyl acetoacetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, γ-butyrolactone, and γ-valerolactone; ether acetate solvents such as ethylene glycol methyl ether propionate, ethylene glycol ethyl ether propionate, ethylene glycol methyl ether acetate, ethylene glycol ethyl ether acetate, diethylene glycol methyl ether acetate, diethylene glycol ethyl ether acetate, diethylene glycol-n-butyl ether acetate, propylene glycol methyl ether acetate, propylene glycol ethyl ether acetate, propylene glycol propyl ether acetate, dipropylene glycol methyl ether acetate, and dipropylene glycol ethyl ether acetate; aprotic polar sovents such as acetonitrile, N-methyl pyrrolidinone, N-ethyl pyrrolidinone, N-propyl pyrrolidinone, N-butyl pyrrolidinone, N-hexyl pyrrolidinone, N-cyclohexyl pyrrolidinone, N,N-dimethyl formamide, N,N-dimethyl acetamide, and dimethyl sulfoxide; alcohol solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxy butanol, n-hexanol, 2-methylpentanol, sec-hexanol, 2-ethylbutanol, sec-heptanol, n-octanol, 2-ethylhexanol, sec-octanol, n-nonyl alcohol, n-decanol, sec-undecyl alcohol, trimethylnonyl alcohol, sec-tetradecyl alcohol, sec-heptadecyl alcohol, phenol, cyclohexanol, methylcyclohexanol, benzyl alcohol, ethylene glycol, 1,2-propylene glycol, 1,3-butylene glycol, diethylene glycol, dipropylene glycol, triethylene glycol, and tripropylene glycol; glycol monoether solvents such as ethylene glycol monomethyl ether, ethylene glycol monoethyl ether, ethylene glycol monophenyl ether, diethylene glycol monomethyl ether, diethylene glycol monoethyl ether, diethylene glycol mono-n-butyl ether, diethylene glycol mono-n-hexyl ether, ethoxy triglycol, tetraethylene glycol mono-n-butyl ether, propylene glycol monomethyl ether, dipropylene glycol monomethyl ether, dipropylene glycol monoethyl ether, and tripropylene glycol monomethyl ether; terpene solvents such as α-terpinene, α-terpinenol, myrcene, alloocimene, limonene, dipentene, α-dipentene, β-dipentene, terpinenol, carvone, ocimene, and phellandrene; water, and the like. These solvents may be used individually or in a combination of two or more thereof From the viewpoint of the coating property of the composition for forming an n-type diffusion layer at a substrate, α-terpinenol, diethylene glycol mono-n-butyl ether, and diethylene glycol mono-n-butyl ether acetate is preferable, and α-terpinenol and diethylene glycol mono-n-butyl ether is more preferable.

The content of the dispersion medium in the p-type diffusion layer forming composition is determined taking into consideration coatability and p-type impurity concentration.

The viscosity of the p-type diffusion layer forming composition is preferably from 10 mPa·s to 1,000,000 mPa·s, and more preferably from 50 mPa·s to 500,000 mPa·s, from the viewpoint of coatability.

In the present invention, at least two kinds of p-type diffusion layer forming compositions in which the concentration of the p-type impurity is different are used. In the present invention, for example, a first p-type diffusion layer forming composition having a high concentration of p-type impurity applied onto an electrode forming region on one surface side of a semiconductor substrate, and a second p-type diffusion layer forming composition having a low concentration of p-type impurity applied onto a region other than the electrode forming region of the same surface or the entire surface thereof. Then, the p-type impurity in the p-type diffusion layer forming composition is made to diffuse into the semiconductor substrate through a heating treatment and thereby the p-type diffusion layer is formed. Accordingly, it is possible to efficiently form a selective emitter having a high concentration of p-type impurity in the electrode forming region.

In regard to the concentration of the p-type impurity in the first p-type diffusion layer forming composition and the second p-type diffusion layer forming composition, as long as the p-type impurity concentration remains greater in the first p-type diffusion layer forming composition, the p-type impurity concentration of the first p-type diffusion layer forming composition is not particularly limited. From the viewpoint of formation efficiency of a high concentration p-type diffusion layer and the photovoltaic efficiency thereof, it is preferable that a ratio of the concentration of the p-type impurity in the first p-type diffusion layer forming composition to the concentration of p-type impurity in the second p-type diffusion layer forming composition (first p-type diffusion layer forming composition/second p-type diffusion layer forming composition) is from 1.1 to 50, and more preferably from 1.2 to 20.

In addition, the concentration of the p-type impurity in the p-type diffusion layer forming composition may be adjusted by selecting the appropriate content rate of glass powder, the content rate of the p-type impurity contained in the glass powder, or the like.

Method for Producing Photovoltaic Cell

First, a damage layer on the surface of the silicon substrate is removed through etching using an acidic or alkalic solution.

Next, a protective film formed of a silicon oxide film or a silicon nitride film on one surface side of the silicon substrate is formed. Here, the silicon oxide film may be formed, for example, by a normal pressure CVD method using silane gas and oxygen. In addition, the silicon nitride film may be formed, for example, by a plasma CVD method using silane gas, ammonia gas, and nitrogen gas.

Next, a minute concavo-convex structure called a texture structure is formed on the surface of the side where the protective film of the silicon substrate is not formed. The texture structure may be formed, for example, by immersing the silicon substrate on which the protective film is formed in liquid including potassium hydroxide and isopropyl alcohol (IPA) at approximately 80° C.

Subsequently, the silicon substrate is immersed in a hydrofluoric acid and thereby the protective film is etched and removed.

Next, a p-type diffusion layer is formed on an n-type silicon substrate and thereby a pn conjunction is formed. In the present invention, the p-type diffusion layer forming composition is applied onto an electrode forming region (region in which an electrode is expected to be formed) in which a light receiving surface electrode is formed, and thereby the impurity concentration in the electrode forming region is made to be higher than a region other than the electrode forming region.

In the present invention, the shape and size of the electrode forming region having a high impurity concentration may be selected appropriately according to the structure of the photovoltaic cell that is composed. The shape, for example, may be a line shape or the like.

In the present invention, the p-type diffusion layer forming composition layer is formed on the n-type silicon substrate by a process of applying the first p-type diffusion layer forming composition in the electrode forming region of the n-type silicon substrate in which the light receiving surface electrode is formed, and a process of applying the second p-type diffusion layer forming composition in at least a region other than the electrode forming region.

Onto the electrode forming region, the first p-type diffusion layer forming composition may be applied alone, or both of the first p-type diffusion layer forming composition and the second p-type diffusion layer forming composition may be applied.

In addition, the sequence of applying the first p-type diffusion layer forming composition and the second p-type diffusion layer forming composition is not particularly limited. That is, after applying the first p-type diffusion layer forming composition in the electrode forming region, the second p-type diffusion layer forming composition may be applied onto the entirety of the light receiving surface or a region other than the electrode forming region. In addition, after applying the second p-type diffusion layer forming composition to the entirety of the light receiving surface or the region other than the electrode forming region, the first p-type diffusion layer forming composition may be applied onto the electrode forming region.

A method of applying the first p-type diffusion layer forming composition and second p-type diffusion layer forming composition is not particularly limited, and a generally used method may be used. For example, a printing method such as a screen printing method or a gravure printing method, a spinning method, a brush coating, a spraying method, a doctor blade method, a roll coater method, an ink jet method, or the like may be used. Furthermore, the method for applying the first p-type diffusion layer forming composition and the second p-type diffusion layer forming composition may be the same as each other or be different from each other.

The amount applied of the first and second p-type diffusion layer forming compositions is not particularly limited. For example, the amount of the glass powder may be set to from $0.01 \text{ g/m}^2$ to $100 \text{ g/m}^2$, and more preferably to from $0.1 \text{ g/m}^2$ to $10 \text{ g/m}^2$. In addition, a ratio of the application amount of the second p-type diffusion layer forming composition to the application amount of the first p-type diffusion layer forming composition (second p-type diffusion layer forming composition/first p-type diffusion layer forming composition) is not particularly limited, and may be appropriately selected in order for the p-type diffusion layer to be formed to have a desired impurity concentration.

After applying the p-type diffusion layer forming composition on the silicon substrate, a heating process which removes at least a part of the dispersion medium may be provided. In the heating process, for example, when a heating treatment is performed at from 100° C. to 200° C., it is possible to volatilize at least a part of a solvent. In addition, for example, at least a part of a binder may be removed through a heating treatment at from 200° C. to 500° C.

Next, the p-type diffusion layer is formed through a heat treatment of the silicon substrate on which the p-type diffusion layer forming composition is applied. Through the heat treatment, the p-type impurity is diffused from the p-type diffusion layer forming composition onto the silicon substrate, and thereby the high concentration p-type diffusion layer is formed in the electrode forming region in which the light receiving surface electrode is formed, and a low concentrated p-type diffusion layer is formed in a region other than the electrode forming region.

Here, it is preferable that the temperature of the heat treatment is from 800° C. to 1100° C., more preferably from 850° C. to 1100° C., and further more preferably from 900° C. to 1100° C.

A glass layer remains on the silicon substrate on which the p-type diffusion layer is formed as described abve, but it is preferable to remove the glass layer. For the removal of the glass layer, a known method such as a method of immersing the silicon substrate in an acid such as a hydrofluroic acid, or a method of immersing the silicon substrate in an alkali such as sodium hydroxide may be exemplified.

Next, on the light receiving surface on which p-type diffusion layer is formed, an antireflective film is formed. Here, as the antireflective film, for example, a nitride film formed by the plasma CVD method may be used.

Next, electrodes are formed on the rear surface of the substrate and on the light receiving surface. The generally used method may be used to form the electrodes without being particularly limited.

For example, in regard to a light receiving surface electrode (a surface electrode), the surface electrode may be formed on the electrode forming region in which the high concentration p-type diffusion layer is formed, by applying a metallic paste for the surface electrode, which includes metallic particles and glass particles, onto the electrode forming region to have a desired shape and by sintering the applied metallic paste.

As the metallic paste for the surface electrode, for example, a silver paste or the like that is generally used in the present technical field may be used.

In addition, a rear surface electrode may be formed by applying, for example, a paste for the rear surface electrode, which includes a metal such as aluminum, silver, and copper, and drying the paste, and by baking the dried paste. At this time, a silver paste for the formation of the silver electrode may be provided on a part of the rear surface for connection between cells in a module process.

EXAMPLES

Hereinafter, the present invention will be described in detail with reference to examples, but the present invention is not limited to the examples. In addition, if not particularly mentioned, as chemicals, a reagent is used as a whole. In addition, "part" and "%" are based on a mass.

Example 1

A glass powder whose particle shape is substantially spherical, average particle diameter is 1.5 μm and softening point is about 810° C. (including $B_2O_3$, $SiO_2$, CaO, MgO, and BaO as main components, with a content rate of 30%, 40%, 10%, 10%, and 10%, respectively), ethyl cellulose, and terpineol are blended and made into a paste in an amount of 20 g, 8 g, and 72 g, respectively, and thereby the first p-type diffusion layer forming composition (composition A) was prepared. In addition, a glass powder whose particle shape is substantially spherical, average particle diameter is 1.5 μm and softening point is about 810° C. (including $B_2O_3$, $SiO_2$, CaO, MgO, and BaO as main components, with a content rate of 30%, 40%, 10%, 10%, and 10%, respectively), ethyl cellulose, and terpineol are blended and made into a paste in the amounts of 5 g, 6 g, and 89 g, respectively, and thereby the second p-type diffusion layer forming composition (composition B) was prepared.

The particle shape of the glass powder was judged by observation with a scanning electron microscope (trade name: TM-1000, manufactured by Hitachi High-Technologies Corporation). The average diameter of the glass powder was calculated with a laser diffraction particle size analyzer (measurement wave length: 632 nm, trade name: LS 13 320, manufactured by Beckman Coulter, Inc.). The softening point of the glass powder was measured by a differential thermal analysis (DTA) curve with a Thermo Gravimetry Differential Thermal Analyzer (trade name: DTG-60H, manufactured by SHIMADZU CORPORATION).

Next, the composition A was applied in a line shape onto a part of a surface of the p-type silicon substrate through screen printing, and the applied composition A was dried at 150° C. for 10 minutes. Subsequently, the composition B was applied onto the entirety of the same surface of the silicon substrate through screen printing, and the applied composition B was dried at 150° C. for 10 minutes. Then, a binder removal treatment was performed at 350° C. for 3 minutes.

Next, a heat treatment was performed in an atmosphere at 950° C. for 10 minutes, and thereby the p-type impurity was made to diffuse into the silicon substrate. Accordingly, the p-type diffusion layer was formed.

Subsequently, the glass layer remaining on the surface of the silicon substrate was removed by a hydrofluoric acid.

The average value of the sheet resistance in a portion (electrode forming region) where the composition A was applied was 58 Ω/square, and the average value of the sheet resistance in the other portion was 127 Ω/square. From these results, it can be seen that the resistance in a portion where the composition A was applied is selectively reduced. The sheet resistance was measured by a four probe method with a low resistance meter (trade name: Loresta-EP MCP-T360, manufactured by Mitsubishi Chemical Analytech Co., Ltd.).

[Manufacturing Photovoltaic Cell]

Using the silicon substrate in which the p-type diffusion layer was formed, which was obtained as described, through a normal method, an antireflective film was formed on a front surface of the silicon substrate, a surface electrode was formed in the electrode forming region, and a rear surface electrode was formed on a rear surface, respectively. Accordingly, a photovoltaic cell was produced. The obtained photovoltaic cell showed excellent photoconversion characteristics compared to a photovoltaic cell that was not provided with an electrode forming region (selective emitter) in which a high concentration p-type diffusion layer was formed.

The sole figure is a flow chart illustrating an embodiment of the invention.

The foregoing description of the embodiments of the present invention has been provided for the purposes of description. It is not intended to be exhaustive or to limit the present invention to the precise forms disclosed. Obviously, many modifications and variations will be apparent to practitioners skilled in the art. The embodiments were chosen and described in order to best explain the principles of the present invention and its practical applications, thereby enabling others skilled in the art to understand the present invention for various embodiments and with the various modifications as are suited to the particular use contemplated. It is intended that the scope of the present invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

The sole figure is a flow chart illustrating an embodiment of the invention.

What is claimed is:

1. A method for producing a photovoltaic cell, comprising:
applying, on a partial region of one surface side of a semiconductor substrate, a first p-type diffusion layer forming composition including a p-type impurity-containing glass powder and a dispersion medium;
applying, on at least a region other than the partial region on the surface of the semiconductor substrate where the first p-type diffusion layer forming composition is applied, a second p-type diffusion layer forming composition which includes a p-type impurity-containing glass powder and a dispersion medium and in which a concentration of the p-type impurity is lower than that of the first p-type diffusion layer forming composition;
heat-treating the semiconductor substrate on which the first p-type diffusion layer forming composition and the second p-type diffusion layer forming composition are applied to form a p-type diffusion layer; and
forming an electrode on the partial region.

2. The method for producing a photovoltaic cell according to claim 1,
wherein the p-type impurity includes at least one kind of element selected from the group consisting of B (boron), Al (aluminum), and Ga (gallium).

3. The method for producing a photovoltaic cell according to claim 1,
wherein the p-type impurity-containing glass powder includes,
at least one kind of p-type impurity-containing material selected from the group consisting of $B_2O_3$, $Al_2O_3$, and $Ga_2O_3$, and
at least one kind of glass component material selected from the group consisting of $SiO_2$, $K_2O$, $Na_2O$, $Li_2O$, BaO, SrO, CaO, MgO, BeO, ZnO, PbO, CdO, $V_2O_5$, SnO, $ZrO_2$, $TiO_2$, and $MoO_3$.

* * * * *